United States Patent [19]

Kii et al.

[11] Patent Number: 5,438,245
[45] Date of Patent: Aug. 1, 1995

[54] HIGH-VOLTAGE GENERATING CIRCUIT

[75] Inventors: Kazuo Kii; Manabu Suzuki; Shigeru Takasu, all of Tokyo, Japan

[73] Assignee: Sony Corporation, Tokyo, Japan

[21] Appl. No.: 59,994

[22] Filed: May 12, 1993

[30] Foreign Application Priority Data

May 27, 1992 [JP] Japan ................. 4-158975

[51] Int. Cl.6 .............. G09G 1/04; H03B 19/00; H03K 4/08; H03K 21/00
[52] U.S. Cl. .................. 315/408; 315/370; 377/47; 327/114; 327/131
[58] Field of Search ............ 315/408, 411, 370, 371, 315/364; 348/536, 540, 542-544; 328/20, 36, 38.1; 307/228; 331/34, 80, 177 R; 377/47

[56] References Cited

U.S. PATENT DOCUMENTS 3,838,344  9/1974  Tanimoto ............... 328/20
4,851,709  7/1989  Bailey ................. 307/228

FOREIGN PATENT DOCUMENTS 0469821   2/1992  European Pat. Off.
63-077271 4/1988  Japan.
2130019   5/1990  Japan.
2292964  12/1990  Japan.
1007181   3/1983  U.S.S.R.

OTHER PUBLICATIONS

Patent Abstracts of Japan, vol. 6, No. 91 JP-A-56035572 (Osawa).
Patent Abstracts of Japan, vol. 6, No. 173, JP-A-57089327 (Nishi).
Patent Abstracts of Japan, vol. 6, No. 107, JP-A-57037920 (Yano).

Primary Examiner—Gregory C. Issing
Attorney, Agent, or Firm—Jay H. Maioli

[57] ABSTRACT

A high-voltage generating circuit for use in a CRT display apparatus has a horizontal drive circuit which is supplied with a horizontal frequency signal synchronous with a horizontal synchronizing signal in an input signal, a high-voltage converter output circuit which can be turned on and off by an output signal from the horizontal drive circuit, and a flyback transformer connected to an output terminal of the high-voltage converter output circuit. A frequency multiplier connected between the horizontal drive circuit and a terminal supplying the horizontal frequency signal to the horizontal drive circuit multiples the frequency of the horizontal signal at the terminal by a multiplication factor variable depending on the frequency of the horizontal frequency signal.

17 Claims, 5 Drawing Sheets

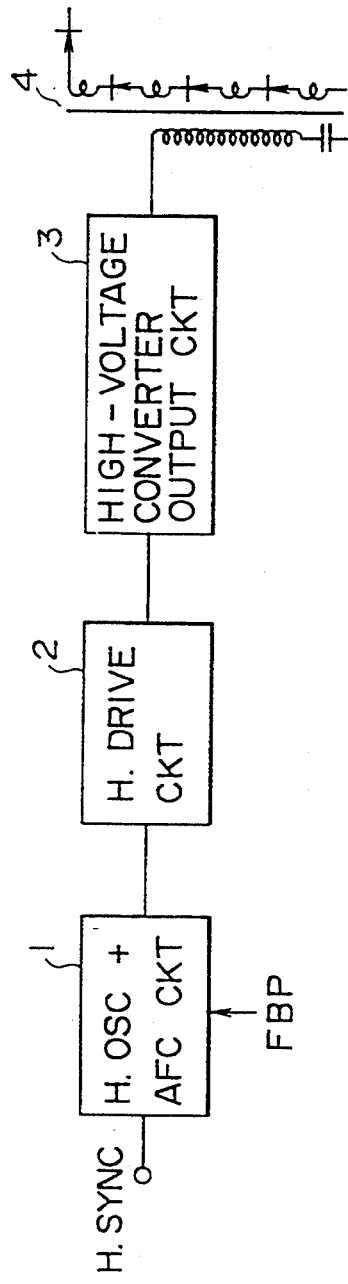
FIG. I
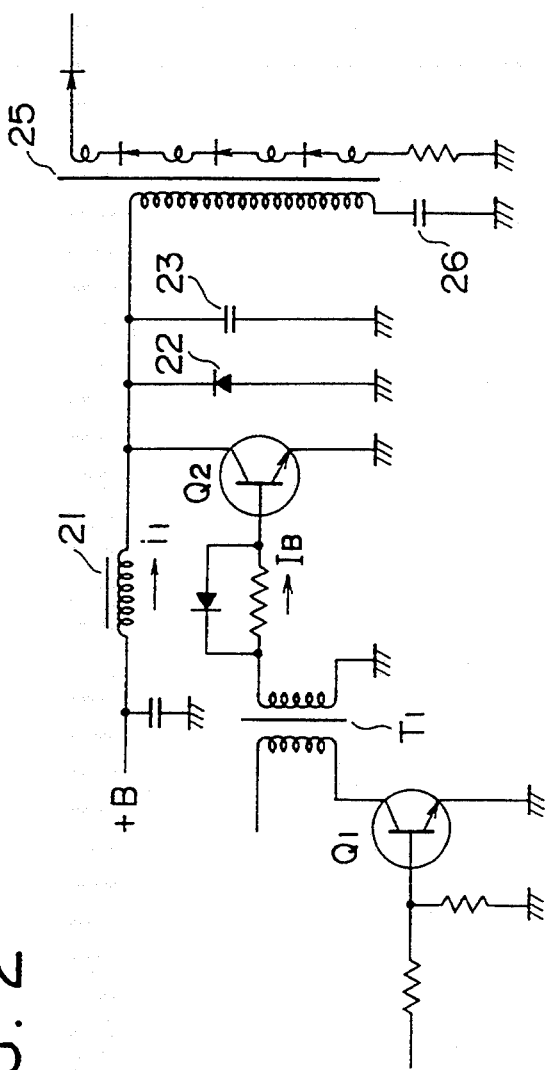
FIG. 2

$\Delta V_1 < \Delta V_2$
$f_2 = 1/2 f_1$

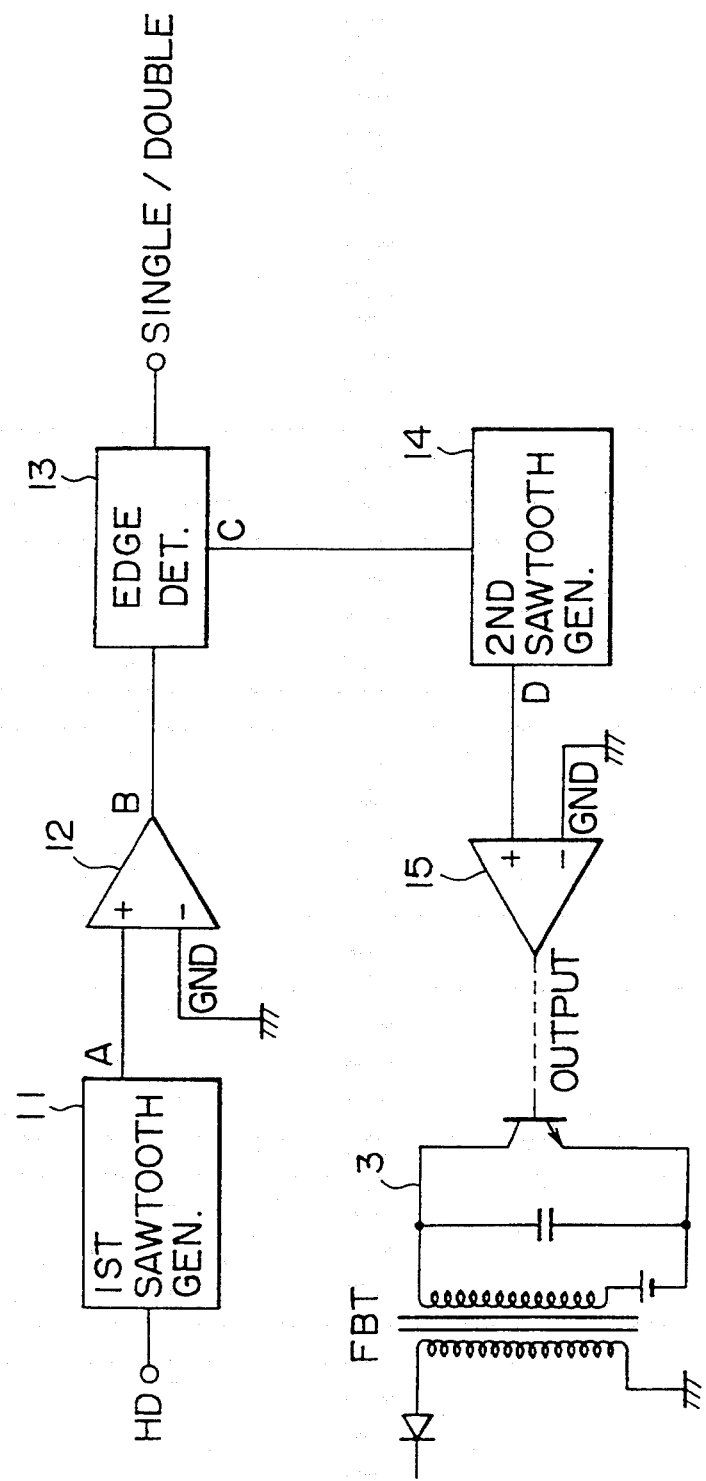
F I G. 5

HIGH-VOLTAGE GENERATING CIRCUIT

BACKGROUND OF THE INVENTION

1. Field of the Invention

The present invention relates to a high-voltage generating circuit, and more particularly to a high-voltage generating circuit for use in a CRT display apparatus. More specifically, the present invention is concerned with a high-voltage generating circuit for use in a CRT display apparatus which is automatically responsive to a signal source having a wide range of horizontal frequencies.

2. Description of the Relevant Art

One general high-voltage generating circuit for use in a CRT display apparatus comprises, as shown in FIG. 1 of the accompanying drawings, a horizontal oscillator and AFC (automatic frequency control) circuit 1, a horizontal drive circuit 2, a high-voltage converter output circuit 3, and a flyback transformer 4. The horizontal oscillator and AFC circuit 1 is supplied with a horizontal synchronizing signal H.sync and also with flyback pulses FBP that are fed back from the output terminal of a horizontal deflection circuit (not shown). The horizontal oscillator and AFC circuit 1 effects an automatic frequency control process to generate horizontal frequency pulses which are horizontally synchronized.

The horizontal oscillator and AFC circuit 1 generally doubles as a drive circuit for the horizontal deflection circuit. The oscillation frequency of a high voltage as well as the frequency of horizontal deflection pulses varies depending on the horizontal frequency of an input signal applied to the horizontal oscillator and AFC circuit 1.

In a multiscan-type display apparatus, for example, the horizontal oscillator and AFC circuit 1 is arranged to respond to a wide range of horizontal frequency signals applied thereto. The horizontal frequency signals include a computer graphic signal of 64 KHz, a high-density videotext signal of 31.5 KHz, and a television signal of 15.7 KHz.

The conventional high-voltage generating circuit for use in a CRT display apparatus suffers various drawbacks when the CRT display apparatus displays an image based on a signal whose horizontal frequency is lower than a horizontal frequency $f_H$ for which the high-voltage generating circuit is originally designed, e.g., an image based on a television signal or a high-density videotext signal. Specifically, the impedance of the choke coil is lowered to allow a large direct current to flow therethrough, giving off an increased amount of heat. Since the horizontal frequency of the image signal is low, the period of time in which a high-voltage load is discharged is increased, resulting in large high-voltage fluctuations. Inasmuch as the horizontal drive transformer cannot continuously supply a sufficient drive current, the high-voltage output transistor fails to operate properly.

To eliminate the above shortcomings, it has been proposed to change inductance values of the choke coil depending on the scanning frequency, change resonant capacitors to increase the duration of flyback pulses, and change horizontal drive transformers. However, these proposals are disadvantageous in that they require a large circuit scale, are expensive as power devices are needed to change the inductance values of the choke coil, the resonant capacitors, and the horizontal drive transformers, and do not provide sufficient merits.

Another solution is to produce a high voltage based on an asynchronous oscillation irrespective of the frequency of the input signal. Since asynchronous noise would appear on the displayed image, however, a magnetic field leakage has to be shielded or high-voltage ripples have to be suppressed to remove such asynchronous noise. Therefore, this solution also poses a cost problem because of the additional measures for asynchronous noise removal.

SUMMARY OF THE INVENTION

It is therefore an object of the present invention to provide a high-voltage generating circuit for use in a CRT display apparatus, which maintains a high switching frequency, causes no high voltage drop, develops no heat buildup, can continuously supply a sufficient switching drive current, and is relatively inexpensive, with respect to an input signal whose horizontal frequency is lower than a horizontal frequency for which the high-voltage generating circuit is basically designed.

According to the present invention, there is provided a high-voltage generating circuit comprising a horizontal drive circuit for being supplied with a horizontal frequency signal synchronous with a horizontal synchronizing signal in an input signal, a high-voltage converter output circuit for being switched by an output signal from the horizontal drive circuit, a flyback transformer connected to an output terminal of the high-voltage converter output circuit, and a frequency multiplier connected between the horizontal drive circuit and a terminal for supplying the horizontal frequency signal to the horizontal drive circuit and having a multiplication factor variable depending on the frequency of the horizontal frequency signal.

According to the present invention, there is also provided a high-voltage generating circuit for use in a CRT display apparatus, comprising a flyback transformer, a high-voltage converter output circuit having an output terminal connected to the flyback transformer, horizontal drive means for switching the high-voltage converter output circuit, supply means for supplying a horizontal frequency signal, frequency multiplier means for multiplying the frequency of the horizontal frequency signal from the supply means and supplying a signal of the multiplied frequency to the horizontal drive means, and control means for controlling the frequency multiplier means to multiply the frequency of the horizontal frequency signal depending on the frequency of the horizontal frequency signal.

According to the present invention, there is further provided a high-voltage generating circuit for use in a CRT display apparatus, comprising a flyback transformer, a high-voltage converter output circuit having an output terminal connected to the flyback transformer, horizontal drive means for switching the high-voltage converter output circuit, supply means for supplying a horizontal frequency signal, first sawtooth generating means triggerable by the horizontal frequency signal supplied thereto from the supply means for generating a sawtooth wave signal, comparator means for comparing the sawtooth wave signal with a predetermined level to generate a square wave signal having a predetermined duty cycle, edge detecting means for detecting positive- and/or negative-going edges of the square wave signal to produce a trigger signal, second sawtooth generating means triggerable by the trigger signal for generating a sawtooth wave signal, means for generating a horizontal drive signal having a desired frequency from the sawtooth wave signal generated by the second sawtooth generating means, and control means for controlling the edge detecting means to detect the positive- and negative-going edges or either the positive- or negative-going edges of the square wave signal depending on the frequency of the horizontal frequency signal.

According to the present invention, there is further provided a high-voltage generating circuit for use in a CRT display apparatus, comprising a flyback transformer, a high-voltage converter output circuit having an output terminal connected to the flyback transformer, horizontal drive means for switching the high-voltage converter output circuit, supply means for supplying a horizontal frequency signal, frequency doubler means for doubling the frequency of the horizontal frequency signal from the supply means and supplying a signal of the doubled frequency to the horizontal drive means, and control means for controlling the frequency doubler means to double the frequency of the horizontal frequency signal depending on the frequency of the horizontal frequency signal.

According to the present invention, there is also provided in a high-voltage generating circuit for use in a CRT display apparatus, having a flyback transformer, a high-voltage converter output circuit having an output terminal connected to the flyback transformer, horizontal drive means for switching the high-voltage converter output circuit, and supply means for supplying a horizontal frequency signal, frequency control means comprising frequency multiplier means for multiplying the frequency of the horizontal frequency signal from the supply means and supplying a signal of the multiplied frequency to the horizontal drive means, and frequency multiplier control means for controlling a multiplication factor of the frequency multiplier means to multiply the frequency of the horizontal frequency signal depending on the frequency of the horizontal frequency signal.

According to the present invention, there is also provided in a high-voltage generating circuit for use in a CRT display apparatus, having a flyback transformer, a high-voltage converter output circuit having an output terminal connected to the flyback transformer, horizontal drive means for switching the high-voltage converter output circuit, and supply means for supplying a horizontal frequency signal, frequency control means comprising frequency multiplier means for multiplying the frequency of the horizontal frequency signal from the supply means and supplying a signal of the multiplied frequency to the horizontal drive means, frequency detecting means for detecting the frequency of the horizontal frequency signal, and frequency multiplier control means for controlling the frequency multiplier means to multiply the frequency of the horizontal frequency signal based on the frequency detected by the frequency detecting means.

According to the present invention, there is also provided a high-voltage generating circuit for use in a CRT display apparatus, comprising a flyback transformer, a high-voltage converter output circuit having an output terminal connected to the flyback transformer, horizontal drive means for switching the high-voltage converter output circuit, supply means for supplying a horizontal frequency signal, frequency multiplier means for multiplying the frequency of the horizontal frequency signal from the supply means and supplying a signal of the multiplied frequency to the horizontal drive means, frequency detecting means for detecting the frequency of the horizontal frequency signal, and frequency multiplier control means for controlling the frequency multiplier means to multiply the frequency of the horizontal frequency signal based on the frequency detected by the frequency detecting means.

According to the present invention, there is further provided a high-voltage generating circuit for use in a CRT display apparatus, comprising a flyback transformer, a high-voltage converter output circuit having an output terminal connected to the flyback transformer, horizontal drive means for switching the high-voltage converter output circuit, supply means for supplying a horizontal frequency signal, frequency doubler means for doubling the frequency of the horizontal frequency signal from the supply means and supplying a signal of the doubled frequency to the horizontal drive means, frequency detecting means for detecting the frequency of the horizontal frequency signal, and frequency doubler control means for controlling the frequency doubler means to double the frequency of the horizontal frequency signal based on the frequency detected by the frequency detecting means.

According to the present invention, there is provided a frequency control device comprising first sawtooth generating means triggerable by a frequency signal supplied thereto for generating a sawtooth wave signal, first comparator means for comparing the sawtooth wave signal with a predetermined level to generate a square wave signal having a predetermined duty cycle, edge detecting means for detecting positive- and/or negative-going edges of the square wave signal to produce a trigger signal, second sawtooth generating means triggerable by the trigger signal for generating a sawtooth wave signal, second comparator means for comparing the sawtooth wave signal generated by the second sawtooth generating means with a predetermined level to produce a square wave signal, and control means for controlling the edge detecting means to detect the positive- and negative-going edges or either the positive- or negative-going edges of the square wave signal depending on the frequency of the frequency signal.

According to the present invention, there is also provided a high-voltage generating circuit for use in a CRT display apparatus, comprising a flyback transformer, a high-voltage converter output circuit having an output terminal connected to the flyback transformer, horizontal drive means for switching the high-voltage converter output circuit with a switching frequency, supply means for supplying a horizontal frequency signal to the horizontal drive means, frequency control means for keeping the switching frequency constant irrespective of the frequency of the horizontal frequency signal.

According to the present invention, there is still further provided a method of multiplying the frequency of a horizontal frequency signal to be supplied to a horizontal drive circuit in a high-voltage generating circuit for use in a CRT display apparatus, the method comprising the steps of detecting the frequency of a horizontal frequency signal, and multiplying the frequency of the horizontal frequency signal if the detected frequency is lower than a predetermined value.

According to the present invention, there is also provided a method of doubling the frequency of a horizontal frequency signal to be supplied to a horizontal drive circuit in a high-voltage generating circuit for use in a CRT display apparatus, the method comprising the steps of detecting the frequency of a horizontal frequency signal, and doubling the frequency of the horizontal frequency signal if the detected frequency is half a predetermined value.

According to the present invention, there is further provided a method of controlling the frequency of a horizontal frequency signal to be supplied to a horizontal drive circuit in a high-voltage generating circuit for use in a CRT display apparatus, the method comprising the steps of generating a first sawtooth wave signal from a horizontal frequency signal, comparing the first sawtooth wave signal with a predetermined level to generate a square wave signal having a predetermined duty cycle, detecting positive- and/or negative-going edges of the square wave signal depending on the frequency of the horizontal frequency signal to produce a trigger signal, generating a second sawtooth wave signal from the trigger signal, and generating a horizontal drive signal having a desired frequency from the second sawtooth wave signal.

According to the present invention, there is also provided a method of controlling the frequency of a horizontal frequency signal to be supplied to a horizontal drive circuit in a high-voltage generating circuit for use in a CRT display apparatus, the method comprising the steps of generating a switching frequency to be supplied to the horizontal drive circuit from the frequency of a horizontal frequency signal, and keeping the switching frequency constant irrespective of the frequency of the horizontal frequency signal.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 1 is a block diagram of a general high-voltage generating circuit;

FIG. 2 is a detailed circuit diagram of a general high-voltage generating circuit;

FIG. 5 is a block diagram of a frequency multiplier in the high-voltage generating circuit shown in FIG. 4.

DETAILED DESCRIPTION OF THE PREFERRED EMBODIMENT

Figure 3A:
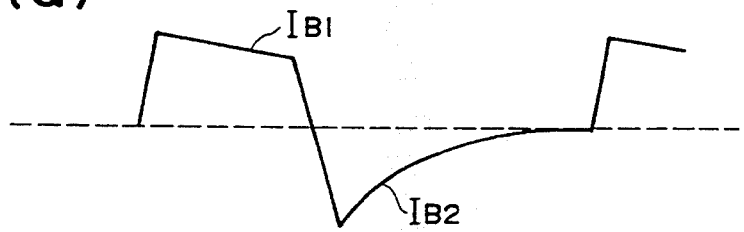
FIGS. 3(a) through 3(f) are diagrams showing the waveforms of voltages and currents in the high-voltage generating circuit shown in FIG. 2.

Prior to describing the present invention, a specific circuit arrangement of a general high-voltage generating circuit will first be described below with reference to FIG. 2.

As shown in FIG. 2, a horizontal drive transistor Q1 has an input terminal supplied with a horizontal oscillating output signal and an output terminal connected to the primary winding of a drive transformer T1. The drive transformer T1 has a secondary winding connected to a high-voltage converter output transistor Q2.

A choke coil 21 is connected to the output terminal of the high-voltage converter output transistor Q2 and also in series to the primary winding of a flyback transformer 25. A damper diode 22 and a resonant capacitor 23 are connected parallel to the primary winding of the flyback transformer 25, which is grounded through a boost capacitor 26.

Figure 3B:
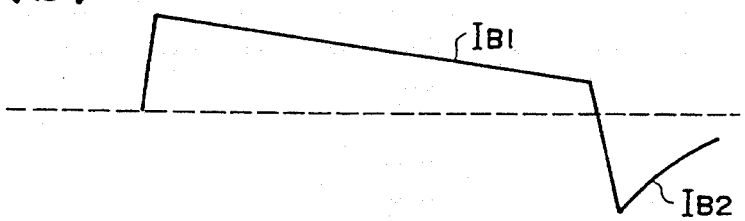

The horizontal drive transistor Q1 turns on and off the high-voltage converter output transistor Q2 through the drive transformer T1. There is an optimum base drive condition for the horizontal drive transistor Q1 to be able to turn on and off the high-voltage converter output transistor Q2 through the drive transformer T1. The base drive condition largely affects the power loss of the high-voltage converter output transistor Q2. If the base drive condition were not met, the high-voltage converter output transistor Q2 cannot properly be turned on and off. Under normal conditions, a base current having a waveform shown in FIG. 3(a) flows into the high-voltage converter output transistor Q2. If the horizontal frequency of a drive signal applied to the high-voltage generating circuit shown in FIG. 2 is lowered, then a base current IB1 is reduced due to the characteristics of the drive transformer T1 as shown in FIG. 3(b). Therefore, no sufficient drive current is supplied to the high-voltage converter output transistor Q2, which thus fails to operate properly.

Figure 3C:
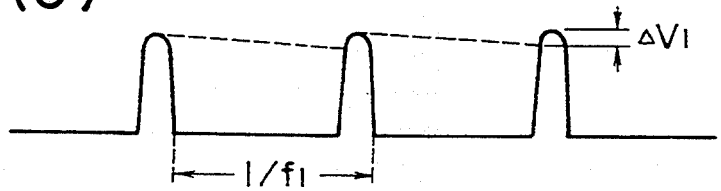
Figure 3D:
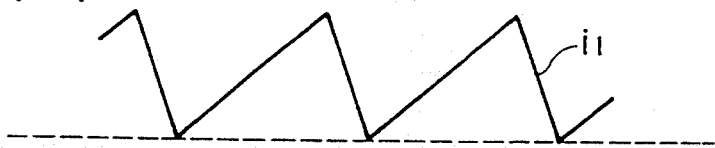

When the horizontal frequency is f1, a current i1 as shown in FIG. 3(d) flows through the choke coil 21. When the horizontal frequency is lowered to f2=($\frac{1}{2}$)f1, the amplitude of the current i1 increases as shown in FIG. 3(f). This is because insofar as the choke coil 21 has a constant inductance L and a constant pulses voltage E is applied to the choke coil 21, the current i1 flowing through the choke coil 21 is represented by E/L as it is integrated with respect to time. Therefore, the choke coil 21 gives off a large amount of heat. At the same time, the current flowing through the flyback transformer 25 increases, and so is the amount of heat generated thereby.

Figure 3E:
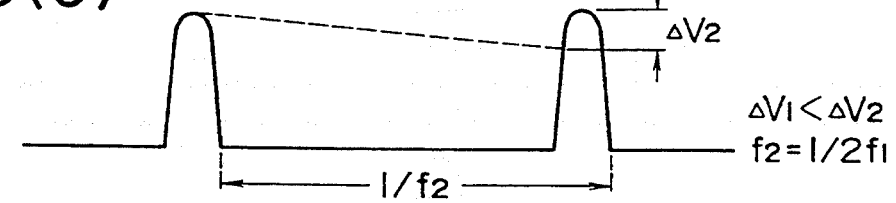
Figure 3F:
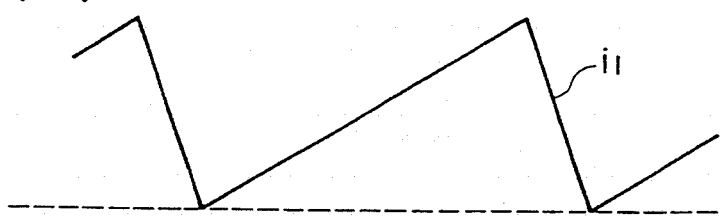

High-voltage outputs or flyback pulses as shown in FIGS. 3(c) and 3(e) are produced from the secondary winding of the flyback transformer 25 at the respective frequencies f1, f2. As shown in FIGS. 3(c) and 3(e), as the horizontal frequency is lowered, a discharge time in which to smooth the flyback pulses is extended. Therefore, at the lower horizontal frequency, a reduction ΔV of the high voltage becomes greater making high-voltage regulation poorer.

According to the principles of the present invention, when the frequency is lower, it is multiplied for driving a high-voltage output circuit, and hence the switching frequency is kept at a high value for which the high-voltage generating circuit is designed.

Figure 4:
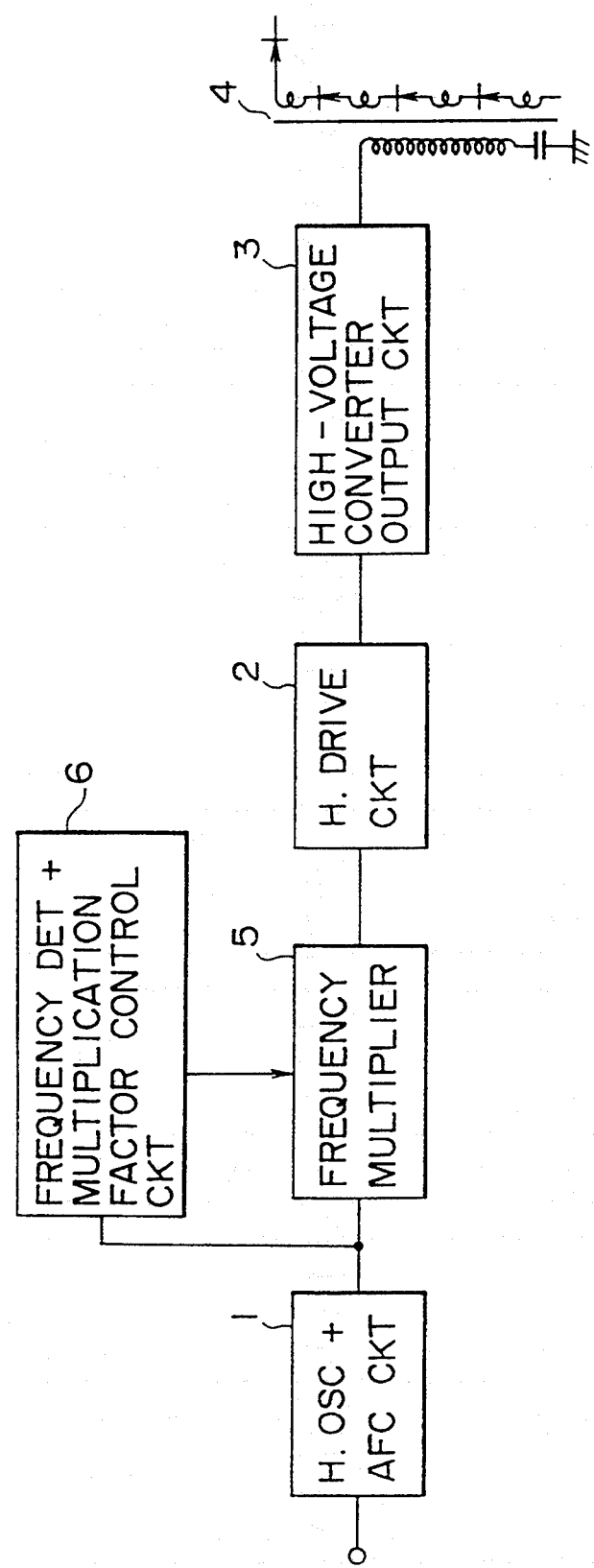
FIG. 4 is a block diagram of a high-voltage generating circuit according to the present invention.

FIG. 4 shows in block form a high-voltage generating circuit according to the present invention. As shown in FIG. 4, the high-voltage generating circuit has a horizontal oscillator and AFC circuit 1, a horizontal drive circuit 2, a high-voltage converter output circuit 3, and a flyback transformer 4 which are identical to those of the conventional high-voltage generating circuit. In addition, the high-voltage generating circuit includes a frequency multiplier 5 connected between the horizontal oscillator and AFC circuit 1 and the horizontal drive circuit 2. The frequency multiplier 5 can multiply an applied horizontal frequency by a multiplication factor n (integer). The frequency multiplier 5 is supplied with a horizontal oscillating output signal from the horizontal oscillator and AFC circuit 1. The high-voltage generating circuit also includes a frequency detection and multiplication factor control circuit 6 for supplying a multiplication factor control signal to the frequency multiplier 5.

The frequency detection and multiplication factor control circuit 6 may comprise a frequency-voltage converter such as a frequency discriminator and a filter for passing a certain frequency for detecting an applied horizontal frequency and controlling a multiplication factor setting section of the frequency multiplier 5 with the multiplication factor control signal that represents the detected horizontal frequency.

Instead of the horizontal oscillating output signal, a horizontal synchronizing signal in a composite video signal may be supplied directly to the frequency multiplier 5 and the frequency detection and multiplication factor control circuit 6.

It is assumed that the high-voltage generating circuit is designed to operate optimally at a horizontal frequency fH=f1. When a signal having a horizontal frequency $f2 = \frac{1}{2} \cdot f_1$ is applied, the frequency detection and multiplication factor control circuit 6 detects the horizontal frequency f2 and supplies a control signal to set the multiplication factor n to 2 to the frequency multiplier 5. The frequency multiplier 5 now doubles the frequency f2 of the horizontal oscillating output signal. Therefore, the horizontal drive circuit 2 and the high-voltage converter output circuit 3 are driven at the horizontal frequency f1 for which the high-voltage generating circuit is designed. When a signal having a horizontal frequency $f3 \approx \frac{1}{3} \cdot f_1$ is applied, the frequency detection and multiplication factor control circuit 6 detects the horizontal frequency f3 and supplies a control signal to set the multiplication factor n to 3 to the frequency multiplier 5.

The frequency multiplier 5 may theoretically have a multiplication function capable of multiplying the input horizontal frequency by a number of multiplication factors. However, since high-voltage generating circuits in actual display apparatus have a high-voltage regulator for regulating a high voltage with a considerable margin, the frequency multiplier 5 may comprise a circuit for multiplying the input horizontal frequency by only multiplication factors of 1 (single) and 2 (or 3) insofar as it is used for an ordinary display apparatus.

FIG. 5 shows in block form a practical circuit arrangement of the frequency multiplier 5. In FIG. 5, the frequency multiplier 5 comprises a frequency doubler for doubling the input horizontal frequency. The frequency multiplier 5 has a first sawtooth generator 11, a first comparator 12 connected to an output terminal of the first sawtooth generator 11, an edge detector 13 connected to an output terminal of the first comparator 12, a second sawtooth generator 14 connected to an output terminal of the edge detector 13, and a second comparator 15 connected to an output terminal of the second sawtooth generator 14. The second comparator 15 has an output terminal connected to the high-voltage converter output circuit 3.

Figure 6:
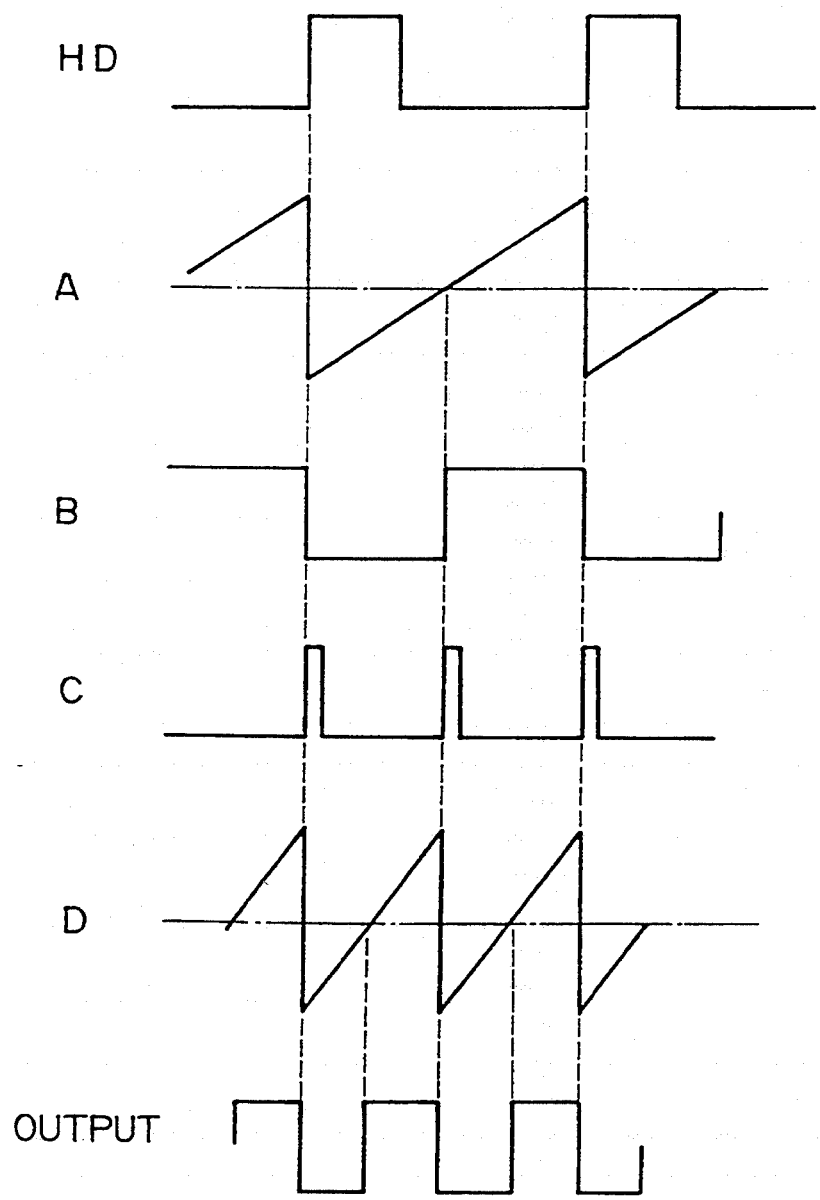
FIG. 6 is a diagram showing signal waveforms in the frequency multiplier shown in FIG. 5.

Operation of the frequency doubler shown in FIG. 5 will be described below with reference to FIG. 6.

When horizontal frequency pulses HD are applied to the first sawtooth generator 11, the first sawtooth generator 11 is triggered by positive-going edges of the horizontal frequency pulses HD, thereby generating a sawtooth wave signal A. The sawtooth waveform signal A is compared with a ground level GND by the second comparator 12, which produces a square wave signal B having a duty cycle of 50%. Then, the edge detector 13 detects positive- and negative-going edges of the square wave signal B, thus generating trigger pulses C. The second sawtooth generator 14 are triggered by the trigger pulses C to generate a sawtooth wave signal D whose frequency is twice the frequency of the horizontal frequency pulses HD. The sawtooth wave signal D is then supplied to the second comparator 15 which compares it with the ground level GND to produce a square wave output signal OUTPUT having a frequency that is twice the frequency of the horizontal frequency pulses HD. The square wave output signal OUTPUT is supplied to the high-voltage converter output circuit 3.

The edge detector 13 has a single/double selector terminal which may be supplied with a multiplication factor control signal from the frequency detection and multiplication factor control circuit 6 for controlling operation of the edge detector 13. Specifically, for example, if the edge detector 13 is controlled through the single/double selector terminal to detect only the positive-going edges of the square wave signal B, then the sawtooth wave signal D generated by the second sawtooth generator 14 is the same as the sawtooth wave signal A. As a result, the frequency doubler 5 shown in FIG. 5 produces the same output signal OUTPUT as the horizontal frequency pulses HD. Therefore, one of the multiplication factors of one (single) and two (double) can be selected by controlling the edge detector 13.

The first and second sawtooth generators 11, 14 may be subject to AGC (automatic gain control) based on peak detection, for example, such that the amplitude of the sawtooth wave signal generated at the frequency of the trigger signal remains unchanged.

If the frequency doubler 5 is incorporated in a multiscan display monitor having an input frequency range of from 24 KHz to 85 KHz, for example, then when an input frequency ranges from 24 KHz to 48 KHz, it is doubled into a frequency range of from 48 KHz to 84 KHz by the high-voltage generating circuit. Therefore, the actual operation range of the high-voltage generating circuit is from 42 KHz to 85 KHz, which may be covered by the marginal regulation range of the high-voltage generating circuit.

Two frequency doublers 5 may be connected in cascade to provide a frequency quadrupler. A frequency tripler may be provided by two comparators 12 one for slicing the sawtooth wave signal A with a level that is $\frac{1}{3}$ of the amplitude thereof and one for slicing the sawtooth wave signal A with a level that is $\frac{2}{3}$ of the amplitude thereof. A frequency quadrupler may also be provided by two comparators 12 for slicing the sawtooth wave signal A with multiple levels. Therefore, a desired frequency multiplier may be achieved based on the circuit arrangement shown in FIG. 5.

It would be possible to use a PLL (phase-locked loop) to provide a frequency multiplier. However, the PLL would suffer a design difficulty such that unless an appropriate locking range is selected, the PLL would tend to be locked to a frequency that is n times the input frequency though it should desirably be locked to a frequency that is twice the input frequency. The frequency multiplier according to the illustrated embodiment is however relatively simple in arrangement and can reliably achieve a desired frequency multiplying mode.

Since the switching frequency for generating a high voltage can be maintained at a high level at all times, the high-voltage generating circuit can reduce the amount of generated heat in a wide range of horizontal frequencies in a multiscan display monitor. The high-voltage generating circuit can stably supply a high voltage through the circuit is composed of relatively small parts.

As the switching frequency is locked to a frequency that is n times the input frequency, no noise appears on the displayed image.

The simple and reliable frequency multiplier allows the high-voltage generating circuit to be responsive to a variety of input signal frequencies within a stable high-voltage operation range of an ordinary multiscan display monitor. The high-voltage generating circuit according to the present invention can be designed simply and manufactured inexpensively.

Although a certain preferred embodiment of the present invention has been shown and described in detail, it should be understood that various changes and modifications may be made therein without departing from the scope of the appended claims.

What is claimed is:

1. A high-voltage generating circuit comprising:
   a horizontal drive circuit supplied with a horizontal frequency signal synchronous with a horizontal synchronizing signal in an input signal for producing a switchinq signal;
   a high-voltage converter output circuit switched by said switching signal from said horizontal drive circuit for producing a high-voltage switched signal;
   a flyback transformer connected to an output of said high-voltage converter output circuit for producing high-voltage flyback pulses; and
   frequency multiplier means connected between said horizontal drive circuit and an input terminal for multiplying a frequency of a horizontal frequency signal input at said input terminal by a multiplication factor and supplying a signal therefrom as said horizontal frequency signal to said horizontal drive circuit, wherein said multiplication factor is variable depending on said frequency of said horizontal frequency signal at said input terminal.

2. A high-voltage generating circuit according to claim 1, wherein said frequency multiplier means comprises frequency detection and multiplication factor control means for detecting said frequency of said horizontal frequency signal at said input terminal and controlling said multiplication factor based on said detected frequency.

3. A high-voltage generating circuit comprising:
   a horizontal drive circuit supplied with a horizontal frequency signal synchronous with a horizontal synchronizing signal in an input signal for producing a switching signal;
   a high-voltage converter output circuit switched by said switching signal from said horizontal drive circuit for producing a high-voltage switched signal;
   a flyback transformer connected to an output of said high-voltage converter output circuit for producing high-voltaqe flyback pulses; and
   frequency multiplier means connected between said horizontal drive circuit and an input terminal for multiplying a frequency. of a horizontal frequency signal input at said input terminal by a multiplication factor and supplying a signal therefrom as said horizontal frequency Signal to said horizontal drive circuit, wherein said multiplication factor is variable depending on said frequency of said horizontal frequency signal at said input terminal;
   said frequency multiplier means comprising:
   first sawtooth generating means supplied with said horizontal frequency signal at said input terminal for generating a sawtooth wave signal;
   comparator means for comparing said sawtooth wave signal with a predetermined level to generate a square wave signal having a predetermined duty cycle;
   edge detecting means for detecting positive- and/or negative-going edges of said square wave signal to produce a trigger signal;
   second sawtooth generating means supplied with said trigger signal for generating a second sawtooth wave signal; and
   means for generating a horizontal drive signal having a desired frequency identical to a frequency of said second sawtooth wave signal generated by said second sawtooth generating means.

4. A high-voltage generating circuit according to claim 3, wherein said edge detecting means comprises means for selecting detection of either the positive- or negative-going edges of said square wave signal or detection of both the positive- and negativegoing edges of said square wave signal.

5. A high-voltage generating circuit according to claim 3 or 4, wherein said means for generating a horizontal drive signal comprises second comparator means for comparing said second sawtooth wave signal generated by said second sawtooth generating means with a predetermined level to produce a second square wave signal.

6. A high-voltage generating circuit according to claim 3 or 4, wherein each of said first and second sawtooth generating means comprises automatic gain control means for controlling a gain thereof to keep said second sawtooth wave signal constant in amplitude.

7. A high-voltage generating circuit for use in a CRT display apparatus, comprising:
   a flyback transformer for producing high-voltage flyback pulses;
   a high-voltage converter output circuit for producing a high-voltage switched signal supplied to said flyback transformer;
   horizontal drive means for switching said high-voltage converter output circuit;
   supply means for supplying a horizontal frequency signal;
   frequency multiplier means for multiplying a frequency of said horizontal frequency signal from said supply means and supplying a signal of the multiplied frequency to said horizontal drive means; and
   control means for controlling said frequency multiplier means to multiply said frequency of said horizontal frequency signal depending on said frequency of said horizontal frequency signal.

8. A high-voltage generating circuit for use in a CRT display apparatus, comprising:
   a flyback transformer for producing high-voltage flyback pulses;
   a high-voltage converter output circuit for producing a high-voltage switched signal supplied to said flyback transformer;

horizontal drive means for switching said high-voltage converter output circuit;

supply means for supplying a horizontal frequency signal;

first sawtooth generating means supplied with said horizontal frequency signal from said supply means for generating a first sawtooth wave signal;

comparator means for comparing said first sawtooth wave signal with a predetermined level to generate a square wave signal having a predetermined duty cycle;

edge detecting means for detecting positive- and/or negative-going edges of said square wave signal to produce a trigger signal;

second sawtooth generating means supplied with said trigger signal for generating a second sawtooth wave signal;

means for generating a horizontal drive signal having a desired frequency identical to a frequency of said second sawtooth wave signal generated by said second sawtooth generating means; and control means for controlling said edge detecting means to detect the positive- and negative-going edges or either the positive- or negative-going edges of said square wave signal depending on a frequency of said horizontal frequency signal.

9. A method of controlling a frequency of a horizontal frequency signal where a signal of a frequency therefrom is supplied to a horizontal drive circuit in a high-voltage generating circuit for use in a CRT display apparatus, said method comprising the steps of:

generating a first sawtooth wave signal from said horizontal frequency signal;

comparing said first sawtooth wave signal with a predetermined level to generate a square wave signal having a predetermined duty cycle;

detecting positive- and/or negative-going edges of said square wave signal depending on said frequency of said horizontal frequency signal to produce a trigger signal;

generating a second sawtooth wave signal of a frequency identical to a frequency of said trigger signal; and generating a horizontal drive signal having a desired frequency identical to said frequency of said second sawtooth wave signal.

10. In a high-voltage generating circuit for use in a CRT display apparatus, having a flyback transformer, a high-voltage converter output circuit having an output connected to said flyback transformer, horizontal drive means for switching said high-voltage converter output circuit, and supply means for supplying a horizontal frequency signal, frequency control means comprising:

frequency multiplier means for multiplying a frequency of said horizontal frequency signal from said supply means by a multiplication factor and supplying a signal of the multiplied frequency to said horizontal drive means; and frequency multiplier control means for controlling said multiplication factor depending on said frequency of said horizontal frequency signal.

11. In a high-voltage generating circuit for use in a CRT display apparatus, having a flyback transformer, a high-voltage converter output circuit having an output terminal connected, horizontal drive means for switching said high-voltage converter output circuit, and supply means for supplying a horizontal frequency signal, frequency control means comprising:

frequency multiplier means for multiplying a frequency of said horizontal frequency signal from said supply means and supplying a signal of the multiplied frequency to said horizontal drive means;

frequency detecting means for detecting said frequency of said horizontal frequency signal; and frequency multiplier control means for controlling said frequency multiplier means to multiply said frequency of said horizontal frequency signal based on said frequency detected by said frequency detecting means.

12. A high-voltage generating circuit for use in a CRT display apparatus, comprising:

a flyback transformer for supplying high-voltage flyback pulses;

a high-voltage converter output circuit for producinq a hiqh-voltage switched signal supplied to said flyback transformer;

horizontal drive means for switching said high-voltage converter output circuit;

supply means for supplying a horizontal frequency signal;

frequency multiplier means for multiplying a frequency of said horizontal frequency signal from said supply means and supplying a signal of the multiplied frequency to said horizontal drive means;

frequency detecting means for detecting said frequency of said horizontal frequency signal; and frequency multiplier control means for controlling said frequency multiplier means to multiply said frequency of said horizontal frequency signal based on said frequency detected by said frequency detecting means.

13. A high-voltage generating circuit for use in a CRT display apparatus, comprising:

a flyback transformer for producing high-voltage flyback pulses;

a high-voltage converter output circuit for producing a high-voltage switched siqnal supplied to said flyback transformer;

horizontal drive means for switching said high-voltage converter output circuit;

supply means for supplying a horizontal frequency signal;

frequency doubler means for doubling a frequency of said horizontal frequency signal from said supply means and supplying a signal of the doubled frequency to said horizontal drive means; and frequency detecting means for detecting said frequency of said horizontal frequency signal; and frequency doubler control means for controlling said frequency doubler means to double said frequency of said horizontal frequency signal based on said frequency detected by said frequency detecting means.

14. A frequency control device comprising:

first sawtooth generating means supplied with a frequency signal for generating a first sawtooth wave signal of a frequency identical to a frequency of said frequency signal;

first comparator means for comparing said first sawtooth wave signal with a predetermined level to generate a first square wave signal having a predetermined duty cycle;

edge detecting means for detecting positive- and/or negative-going edges of said first square wave signal to produce a trigger signal;

second sawtooth generating means supplied with said trigger signal for generating a second sawtooth wave signal of a frequency identical to a frequency of said trigger signal;

second comparator means for comparing said second sawtooth wave signal generated by said second sawtooth generating means with a predetermined level to produce a second square wave signal; and control means for controlling said edge detecting means to detect the positive- and negative-going edges or either the positive- or negative-going edges of said first square wave signal depending on said frequency of said frequency signal.

15. A high-voltage generating circuit for use in a CRT display apparatus, comprising:

a flyback transformer for producing high-voltage flyback pulses;

a high-voltage converter output circuit for producing a hiqh-voltage switched siqnal supplied to said flyback transformer;

horizontal drive means for switching said high-voltage converter output circuit with a switching frequency;

supply means for supplying a horizontal frequency signal to said horizontal drive means; and frequency control means for keeping said switching frequency constant irrespective of frequency of said horizontal frequency signal.

16. A method of multiplying a frequency of a horizontal frequency signal where a signal of a frequency therefrom is supplied to a horizontal drive circuit in a high-voltage generating circuit for use in a CRT display apparatus, said method comprising the steps of:

detecting said frequency of said horizontal frequency signal; and multiplying said frequency of said horizontal frequency signal if the detected frequency is lower than a predetermined value.

17. A method of doubling a frequency of a horizontal frequency signal where a signal of a frequency therefrom is supplied to a horizontal drive circuit in a high-voltage generating circuit for use in a CRT display apparatus, said method comprising the steps of:

detecting said frequency of said horizontal frequency signal; and doubling said frequency of said horizontal frequency signal if the detected frequency is half a predetermined value.

* * * * *

UNITED STATES PATENT AND TRADEMARK OFFICE
CERTIFICATE OF CORRECTION

PATENT NO. : 5,438,245
DATED : August 1, 1995
INVENTOR(S) : Kazuo Kii, Manabu Suzuki, Shigeru Takasu It is certified that error appears in the above-indentified patent and that said Letters Patent is hereby corrected as shown below:

Col. 6, line 23, change "IB1 is" to -- $I_{B1}$ is --.

Col. 9, line 29, change "switchinq" to --switching--
        line 67, after "frequency" delete "."
Col. 10, line 2, change "Signal" to --signal--
        line 28, change "negativegoing" to --negative-going--
Col. 12, line 18, change "hiqh" to --high--
        line 41, change "siqnal" to --signal--
Col. 13, line 22, change "hiqh" to --high--
        same line, change "siqnal" to --signal--

Signed and Sealed this

Eleventh Day of February, 1997

Attest:

BRUCE LEHMAN

*Attesting Officer*    *Commissioner of Patents and Trademarks*